(12) United States Patent
Nakabayashi et al.

(10) Patent No.: US 11,528,810 B2
(45) Date of Patent: Dec. 13, 2022

(54) WIRING BOARD

(71) Applicant: SHINKO ELECTRIC INDUSTRIES CO., LTD., Nagano (JP)

(72) Inventors: Yoko Nakabayashi, Nagano (JP); Yuta Sakaguchi, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 186 days.

(21) Appl. No.: 17/165,028

(22) Filed: Feb. 2, 2021

(65) Prior Publication Data

US 2021/0243902 A1 Aug. 5, 2021

(30) Foreign Application Priority Data

Feb. 5, 2020 (JP) .............................. JP2020-018318

(51) Int. Cl.
| | | |
|---|---|---|
| *H05K 1/02* | (2006.01) | |
| *H05K 1/11* | (2006.01) | |
| *H05K 3/24* | (2006.01) | |
| *H01L 21/48* | (2006.01) | |
| *H01L 23/00* | (2006.01) | |
| *H01L 23/15* | (2006.01) | |

(Continued)

(52) U.S. Cl.
CPC .............. *H05K 3/381* (2013.01); *H01L 24/29* (2013.01); *H05K 1/0298* (2013.01); *H05K 3/422* (2013.01); *H05K 3/4667* (2013.01); *H05K 3/341* (2013.01); *H05K 2201/09209* (2013.01)

(58) Field of Classification Search
CPC .......... H05K 1/02; H05K 1/0298; H05K 1/11; H05K 1/111; H05K 1/112; H05K 1/115; H05K 3/24; H05K 3/244; H05K 3/341; H05K 3/381; H05K 3/422; H05K 3/4667; H05K 2201/09209; H01L 21/48; H01L 21/486; H01L 21/3205; H01L 23/00; H01L 23/15; H01L 23/31; H01L 23/498; H01L 23/528; H01L 24/03; H01L 24/13; H01L 24/29

USPC ................. 174/258, 59, 251, 257, 262, 264; 361/767; 29/852; 428/209; 430/315

See application file for complete search history.

(56) References Cited

U.S. PATENT DOCUMENTS

2003/0102160 A1* 6/2003 Gaudiello .............. H05K 3/244 428/209
2015/0282307 A1* 10/2015 Shimizu ................. H05K 1/111 174/264

(Continued)

FOREIGN PATENT DOCUMENTS

JP 2006-005322 1/2006

*Primary Examiner* — Xiaoliang Chen
(74) *Attorney, Agent, or Firm* — Rankin, Hill & Clark LLP

(57) ABSTRACT

A wiring board includes: an insulating layer; and a connection terminal formed on the insulating layer. The connection terminal includes a first metal layer laminated on the insulating layer, a second metal layer laminated on the first metal layer, a metal pad laminated on the second metal layer, and a surface treatment layer that covers an upper surface and a side surface of the pad and that is in contact with the upper surface of the insulating layer. An end portion of the second metal layer is in contact with the surface treatment layer, and an end portion of the first metal layer is positioned closer to a center side of the pad than the end portion of the second metal layer is to form a gap between the end portion of the first metal layer and the surface treatment layer.

4 Claims, 9 Drawing Sheets

(51) Int. Cl.
    *H01L 23/31*     (2006.01)
    *H01L 23/498*     (2006.01)
    *H01L 23/528*     (2006.01)
    *H05K 3/38*     (2006.01)
    *H05K 3/46*     (2006.01)
    *H05K 3/42*     (2006.01)
    *H05K 3/34*     (2006.01)

(56) References Cited

U.S. PATENT DOCUMENTS

| | | | |
|---|---|---|---|
| 2017/0263545 A1* | 9/2017 | Tsukamoto | H01L 23/49822 |
| 2017/0352632 A1* | 12/2017 | Cheng | H01L 25/105 |
| 2020/0373233 A1* | 11/2020 | Nishimura | H01L 21/486 |

* cited by examiner

WIRING BOARD

CROSS-REFERENCE TO RELATED APPLICATION

This application is based upon and claims the benefit of priority of the prior Japanese Patent Application No. 2020-018318, filed on Feb. 5, 2020, the entire contents of which are incorporated herein by reference.

FIELD

The embodiment discussed herein is related to a wiring board and a method of manufacturing a wiring board.

BACKGROUND

In recent years, with the development of the electronic industry, the high performance, high functionality, and compact size of electronic components are required. For this purpose, for example, in a wiring board on which semiconductor chips are mounted, high integration, thinning, and fine circuit patterning are required.

Generally, electronic components such as semiconductor chips are joined to connection terminals formed on a surface of a wiring board by using solder. Specifically, a seed layer of metal such as copper is formed on a surface of an insulating layer forming the wiring board, and a pad made of metal such as copper is formed on an upper surface of the seed layer to form a connection terminal. Then, solder is supplied to this connection terminal, and the connection terminal of the wiring board and a connection terminal of a semiconductor chip are joined through the solder. As necessary, the solder may be supplied to the connection terminal of the semiconductor chip.

For the purpose of improving the wettability of the solder and the like, a surface treatment layer may be formed of nickel, palladium, gold plating (a gold plating layer is on the front side), or the like on a surface of the connection terminal of the wiring board. An example of related art is described in Japanese Patent Application Laid-open No. 2006-005322.

However, at the connection terminal of the wiring board described above, there is a problem in that metal such as copper, which is a material for the seed layer and the pad, diffuses and cracks may occur in the solder for joining the electronic components. That is, since the seed layer and the pad are formed of, for example, copper as a material, copper atoms diffuse and move to the solder for joining the semiconductor chip, and an alloy layer containing copper is formed inside the solder. As a result, breakage is likely to occur at an interface between the solder and the alloy layer, and cracks may occur. In a case where the cracks occur in the solder, conduction resistance increases, and the connection reliability of the electronic components decreases.

In a case where the surface treatment layer is formed on the surface of the connection terminal of the wiring board, the diffusion of copper electrons from the seed layer and the pad is suppressed, but the occurrence frequency of cracks in the solder is not sufficiently reduced. In particular, as the miniaturization of wiring on the wiring board progresses, the amount of copper per unit area on the wiring board increases. Accordingly, the diffusion amount of copper atoms increases, and the occurrence frequency of cracks in the solder increases.

SUMMARY

According to an aspect of an embodiment, a wiring board includes: an insulating layer; and a connection terminal formed on an upper surface of the insulating layer. The connection terminal includes a first metal layer laminated on the upper surface of the insulating layer, a second metal layer laminated on an upper surface of the first metal layer, a metal pad laminated on an upper surface of the second metal layer, and a surface treatment layer that covers an upper surface and a side surface of the pad and that is in contact with the upper surface of the insulating layer, an end portion of the second metal layer is in contact with the surface treatment layer, and an end portion of the first metal layer is positioned closer to a center side of the pad than the end portion of the second metal layer is to form a gap between the end portion of the first metal layer and the surface treatment layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Hereinafter, an embodiment of a wiring board and a method of manufacturing a wiring board disclosed in the present application will be described in detail with reference to the accompanying drawings. It is noted that the present invention is not limited to this embodiment.

Figure 1A:
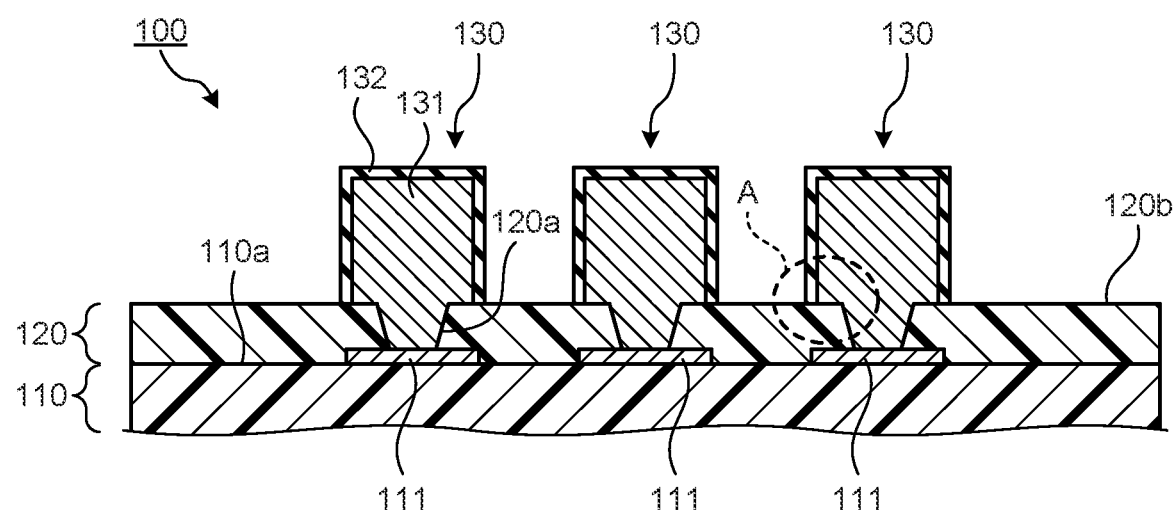
FIGS. 1A and 1B are diagrams illustrating a structure of a wiring board according to an embodiment.
Figure 1B:
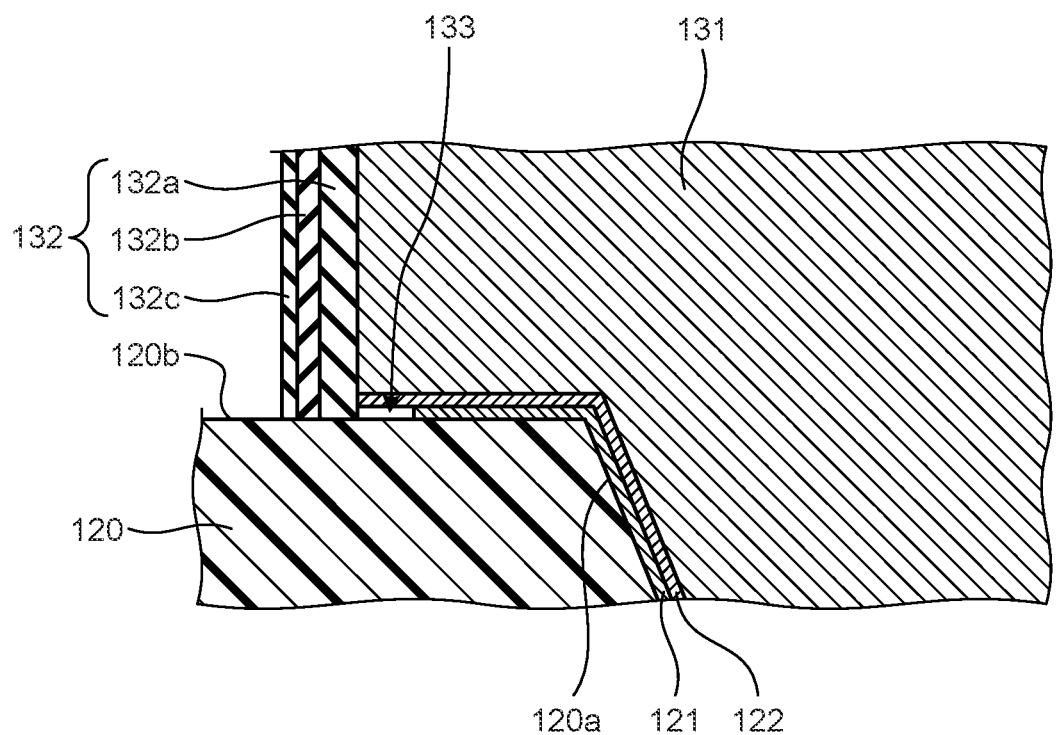

FIGS. 1A and 1B are diagrams illustrating a structure of a wiring board 100 according to an embodiment. Specifically, FIG. 1A is a partial sectional view of the vicinity of a surface of the wiring board 100, and FIG. 1B is an enlarged view of part A in FIG. 1A. In the following description, the surface on which connection terminals 130 in FIG. 1A are formed is referred to as an "upper surface" of the wiring board 100, and the vertical direction is defined according to this. However, the wiring board 100 may be manufactured and used upside down and may be manufactured and used in any posture, for example.

The wiring board 100 includes insulating layers 110 and 120, a wiring layer 111, and the connection terminals 130. Although not illustrated in FIG. 1A, other insulating layers and wiring layers may be formed below the insulating layer 110, and for example, a core layer made of glass may be formed.

The insulating layer 110 is formed by using an insulating resin containing, for example, an epoxy-based resin or a polyimide-based resin as a main component. As the insulating resin, for example, a thermosetting insulating resin or a photosensitive insulating resin can be used. A thickness of the insulating layer 110 can be, for example, approximately 20 µm to 45 µm. The insulating layer 110 may contain a filler such as silica ($SiO_2$).

The wiring layer 111 is patterned on an upper surface 110a of the insulating layer 110 in a predetermined planar shape. As a material of the wiring layer 111, for example, copper (Cu) or the like can be used. A thickness of the wiring layer 111 can be, for example, approximately 10 µm to 20 µm. The wiring layer 111 may be connected to a wiring layer (not illustrated) below the insulating layer 110 via a via wiring (not illustrated) or the like that penetrates the insulating layer 110.

The insulating layer 120 is formed on the upper surface 110a of the insulating layer 110 so as to cover the wiring layer 111. The insulating layer 120 is the outermost insulating layer on the upper surface side of the wiring board 100. A material and thickness of the insulating layer 120 can be the same as those of the insulating layer 110, for example. Similarly to the insulating layer 110, the insulating layer 120 may also contain a filler such as silica ($SiO_2$).

The insulating layer 120 is formed with via-holes 120a that penetrate the insulating layer 120 and through which an upper surface of the wiring layer 111 is exposed at the bottom of the via-holes 120a. The via-holes 120a may each be an inverted truncated cone-shaped through-hole having a diameter of an opening portion that opens to an upper surface 120b side of the insulating layer 120 larger than a diameter of an opening portion of the bottom at which the upper surface of the wiring layer 111 is exposed The connection terminals 130 are each a protrusion electrode formed to protrude from the upper surface 120b of the insulating layer 120, and can be electrically connected to an electronic component such as semiconductor chip, for example. The connection terminal 130 includes a pad 131 and a surface treatment layer 132.

The pad 131 is an electrode that is a main body of the connection terminal 130, and is formed by, for example, electrolytic plating of copper (Cu). Specifically, as illustrated in FIG. 1B, an adhesion layer 121 is formed on the upper surface 120b of the insulating layer 120, a seed layer 122 is formed on an upper surface of the adhesion layer 121, and the pad 131 is formed on an upper surface of the seed layer 122 by electrolytic plating. The pad 131 can be formed by, for example, a semi-additive method or a subtractive method. A thickness of the pad 131 (the thickness of only the part above the upper surface of the seed layer 122, in which a thickness of the part inside the via-hole 120a is excluded) can be, for example, approximately 2 µm to 15 µm. In addition, a pitch between the pads 131 can be, for example, approximately 20 µm to 50 µm.

The surface treatment layer 132 is a metal layer covering the upper surface and side surface of the pad 131. Specifically, as illustrated in FIG. 1B, the surface treatment layer 132 includes a nickel (Ni) layer 132a, a palladium (Pd) layer 132b, and a gold plating (Au) layer 132c in this order from the side closer to the pad 131. The Ni layer 132a, the Pd layer 132b, and the Au layer 132c can be formed by, for example, an electrolytic plating method or an electroless plating method. As the surface treatment layer 132, Ni and Au layers may be used instead of the Ni, Pd, and Au layers. Alternatively, a nickel alloy layer may be used instead of the Ni layer 132a. Examples of nickel alloys include nickel-phosphorus (Ni—P), nickel boron (Ni—B), and the like.

A configuration of a lower end portion of the connection terminal 130 will be specifically described with reference to FIG. 1B.

The adhesion layer 121 and the seed layer 122 are formed on an inner surface of the via-hole 120a and the upper surface 120b of the insulating layer 120, and the pad 131 is formed on the upper surface of the seed layer 122. The adhesion layer 121 is made of, for example, titanium (Ti), chromium (Cr), or the like, and is formed by a sputtering method or an electroless plating method. By forming the adhesion layer 121, the adhesiveness of the seed layer 122 to the upper surface 120b of the insulating layer 120 is improved. A thickness of the adhesion layer 121 can be, for example, approximately 10 nm to 500 nm.

The seed layer 122 is made of, for example, copper (Cu) and is laminated on the upper surface of the adhesion layer 121 by a sputtering method or an electroless plating method. A thickness of the seed layer 122 is, for example, approximately 100 nm to 300 nm, and is usually thicker than that of the adhesion layer 121. As a material of the seed layer 122, for example, nickel (Ni), a copper-nickel alloy (Cu—Ni), or the like can be used, but herein, copper (Cu) is used.

As illustrated in FIG. 1B, a side end portion of the seed layer 122 extends to the same position as a side surface of the pad 131 and is in contact with the Ni layer 132a that is the innermost layer of the surface treatment layer 132. On the other hand, a side end portion of the adhesion layer 121 is positioned closer to the center side than the side surface of the pad 131 is, and is not in contact with the Ni layer 132a, thereby forming a gap 133. That is, since the end portion of the adhesion layer 121 is positioned closer to the center side of the pad 131 than the end portion of the seed layer 122 is, the gap 133 is formed near the end portion of the adhesion layer 121 to be surrounded by the end portion of the adhesion layer 121, a lower surface of the seed layer 122, the upper surface 120b of the insulating layer 120, and the Ni layer 132a. A width of the gap 133 (a distance between the end portion of the adhesion layer 121 and the Ni layer 132a) is, for example, approximately 300 nm.

The lower surface of the seed layer 122 and the surface treatment layer 132 (the Ni layer 132a) are separated from each other by forming the gap 133, so that the diffusion of copper atoms from the seed layer 122 can be suppressed. That is, in a case where the end portion of the adhesion layer 121 is in contact with the Ni layer 132a, the copper atoms of the seed layer 122 can pass through the adhesion layer 121 from the lower surface of the seed layer 122 and can diffuse to the surface treatment layer 132 and solder that joins the connection terminal 130 and the electronic components. By contrast, in a case where the gap 133 is formed, a diffusion path where the copper atoms pass through the adhesion layer 121 from the lower surface of the seed layer 122 to the surface treatment layer 132 is separated. As a result, the diffusion of the copper atoms can be suppressed, and the occurrence of cracks in the solder that joins the connection terminal 130 and the electronic components can be suppressed.

In particular, copper crystal grains forming the seed layer 122 are smaller and more likely to diffuse than copper crystal grains forming the pad 131. Therefore, by suppressing the diffusion of copper atoms from the lower surface of the seed layer 122, the amount of copper diffused from the seed layer 122 to the solder is effectively reduced, and the occurrence of cracks due to the formation of an alloy layer inside the solder can be suppressed.

Figure 2:
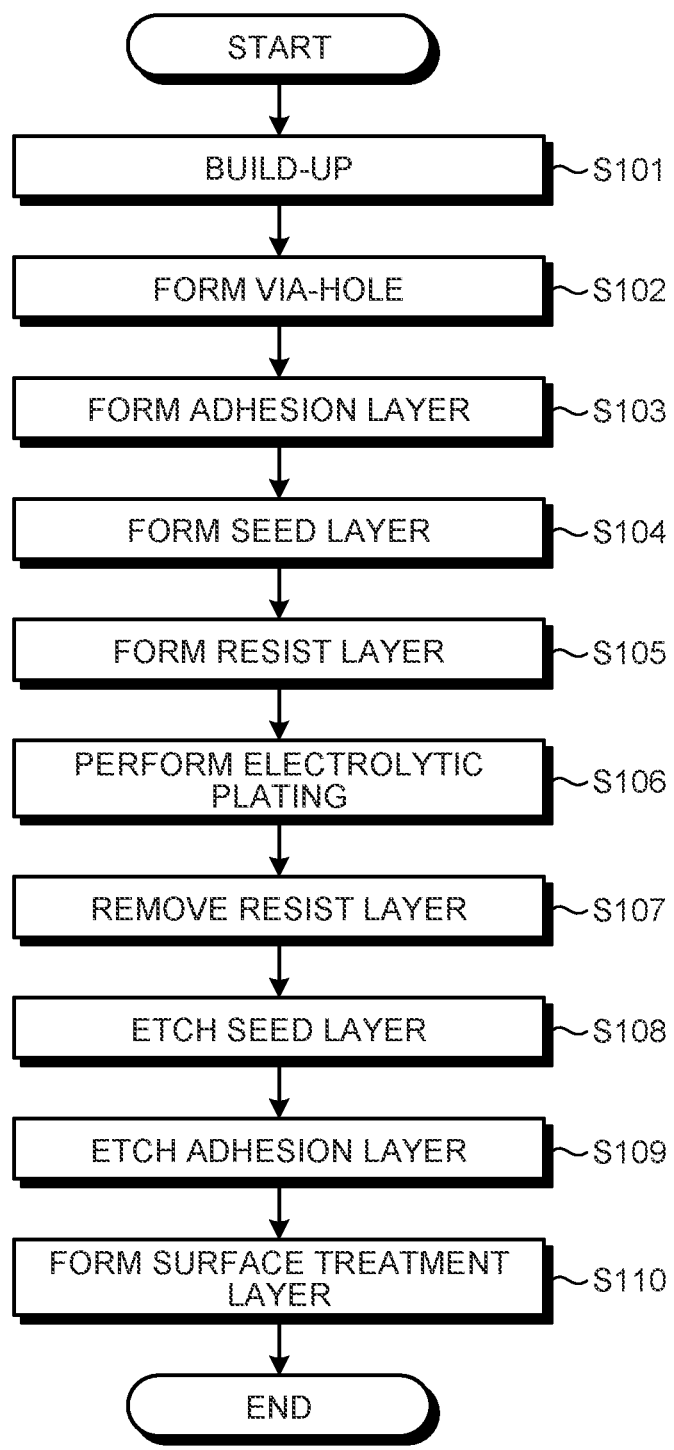
FIG. 2 is a flowchart illustrating a method of manufacturing the wiring board according to the embodiment.

Next, a method of manufacturing the wiring board 100 configured as described above will be specifically described with reference to the flowchart illustrated in FIG. 2.

Figure 3:
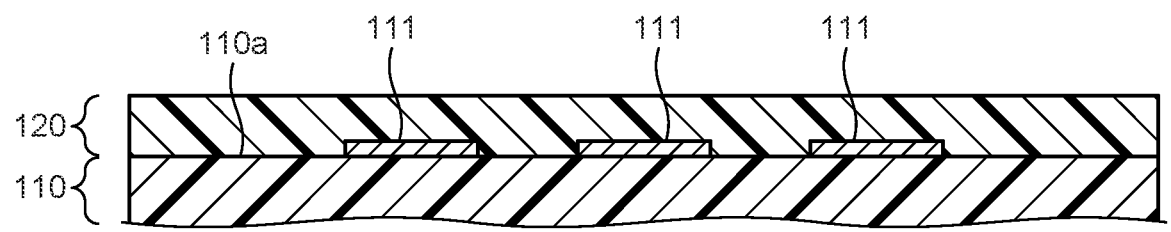
FIG. 3 is a diagram illustrating a specific example of a build-up step.

First, the main body of the wiring board 100 is formed by a build-up method of laminating the insulating layer 110, the wiring layer 111, and the insulating layer 120 (step S101). Specifically, for example, as illustrated in FIG. 3, the insulating layer 110 is formed on an upper surface of another wiring layer, insulating layer, core layer, or the like (not illustrated), and the wiring layer 111 is formed on the upper surface 110a of the insulating layer 110. The wiring layer 111 is formed by a semi-additive method, for example, by patterning copper (Cu) into a predetermined planar shape. Then, the insulating layer 120 is laminated on the upper surface 110a of the insulating layer 110 so as to cover the wiring layer 111. The insulating layer 120 is the outermost insulating layer on the upper surface side of the wiring board 100.

Figure 4:
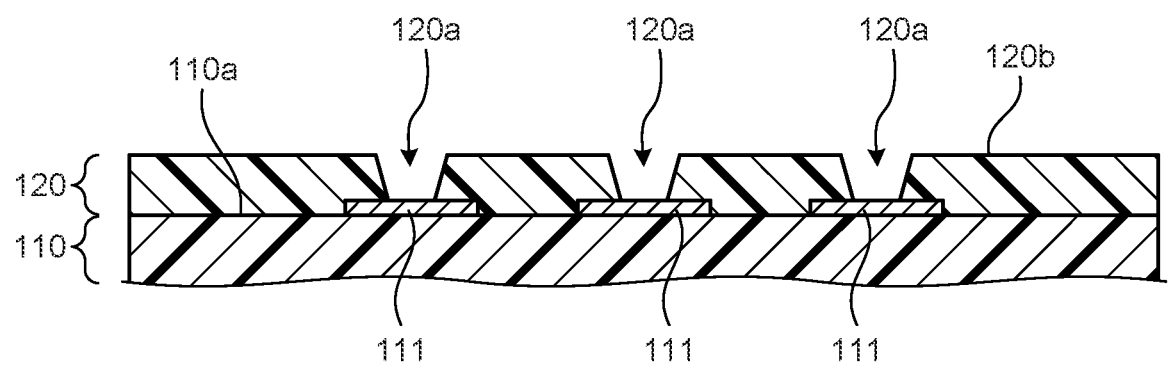
FIG. 4 is a diagram illustrating a specific example of a via-hole forming step.

In a case where the insulating layer 110, the wiring layer 111, and the insulating layer 120 are laminated, the via-holes 120a are formed in the insulating layer 120 (step S102). That is, for example, as illustrated in FIG. 4, the via-holes 120a, which penetrate the insulating layer 120 and through which the upper surface of the wiring layer 111 is exposed at the bottom, are formed. The via-holes 120a can be formed by, for example, a laser processing method using a $CO_2$ laser. In a case where the via-holes 120a are formed by the laser processing method, desmear treatment is performed to remove resin residues adhering to the upper surface of the wiring layer 111 exposed at the bottom of the via-holes 120a. In a case where a sputtering method is used at the step of forming the adhesion layer 121, which will be described later, the resin residues are removed during the formation of the adhesion layer 121, so that desmear treatment of the via-holes 120a is unnecessary.

In addition, the via-holes 120a may be formed by, for example, a photolithography method. That is, in a case where a photosensitive insulating resin is used as the material of the insulating layer 120, the via-holes 120a can be formed by the photolithography method, and in this case, the diameter of the opening portion on the upper surface 120b side of the via-holes 120a can be reduced. As a result, in a case where the connection terminals 130 are formed directly above the via-holes 120a, the connection terminals 130 can be miniaturized.

Figure 5:
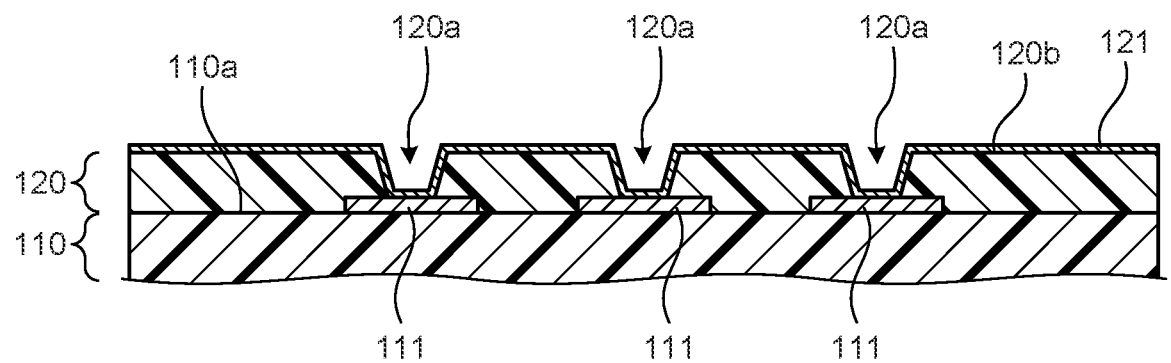
FIG. 5 is a diagram illustrating a specific example of an adhesion layer forming step.

After the via-holes 120a are formed, the adhesion layer 121 is formed on the upper surface 120b of the insulating layer 120 (step S103). Specifically, for example, as illustrated in FIG. 5, the adhesion layer 121 that continuously covers the upper surface 120b of the insulating layer 120, the inner surface of the via-holes 120a, and the upper surface of the wiring layer 111 exposed at the bottom of the via-holes 120a is formed by, for example, a sputtering method or an electroless plating method. As a material of the adhesion layer 121, for example, titanium (Ti), chromium (Cr), or the like can be used. A thickness of the adhesion layer 121 can be, for example, approximately 10 nm to 500 nm.

Figure 6:
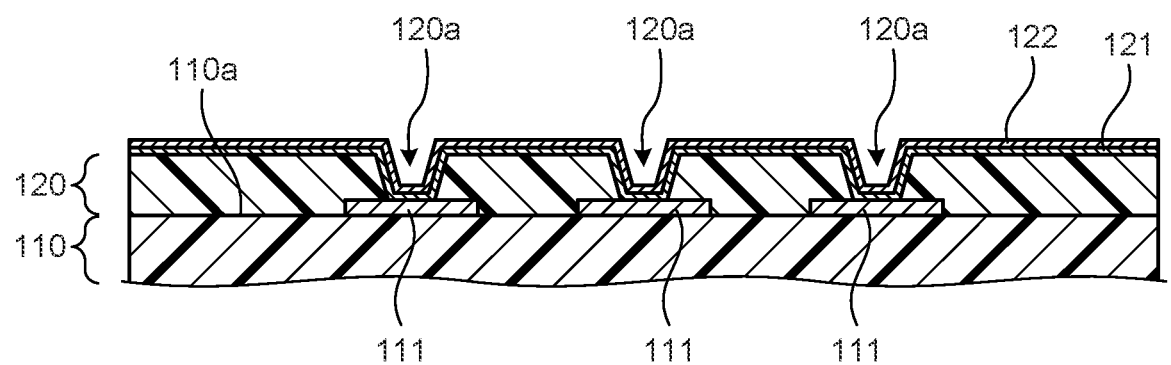
FIG. 6 is a diagram illustrating a specific example of a seed layer forming step.

Then, the seed layer 122 is formed on the upper surface of the adhesion layer 121 (step S104). Specifically, for example, as illustrated in FIG. 6, the seed layer 122 covering the upper surface of the adhesion layer 121 is formed by, for example, a sputtering method or an electroless plating method. As a material of the seed layer 122, for example, copper (Cu), nickel (Ni), a copper-nickel alloy (Cu—Ni), or the like can be used, but herein, copper (Cu) is used. A thickness of the seed layer 122 can be, for example, approximately 100 nm to 300 nm. Since the adhesion layer 121 made of, for example, titanium is formed below the seed layer 122, the adhesiveness between the insulating layer 120 and the seed layer 122 is excellent.

Figure 7:
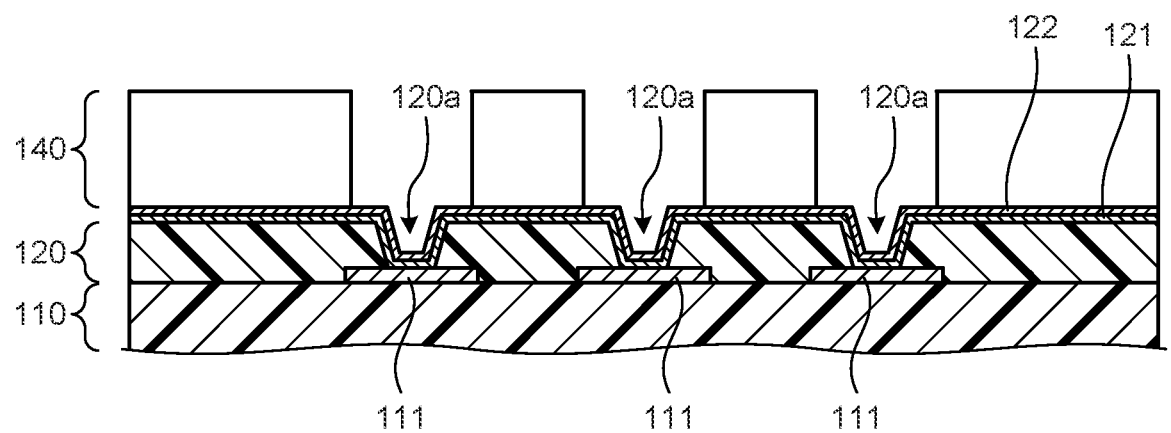
FIG. 7 is a diagram illustrating a specific example of a resist layer forming step.

After the seed layer 122 is formed, a resist layer is formed on the upper surface of the seed layer 122 (step S105). That is, for example, as illustrated in FIG. 7, a resist layer 140 having opening portions formed at the positions of the via-holes 120a is formed. Here, since the connection terminals 130 are formed at the positions of the via-holes 120a, the opening portions of the resist layer 140 are provided at the positions of the via-holes 120a. However, in a case where another connection terminal is formed, an opening portion of the resist layer 140 is also provided at the position corresponding to this connection terminal.

Figure 8:
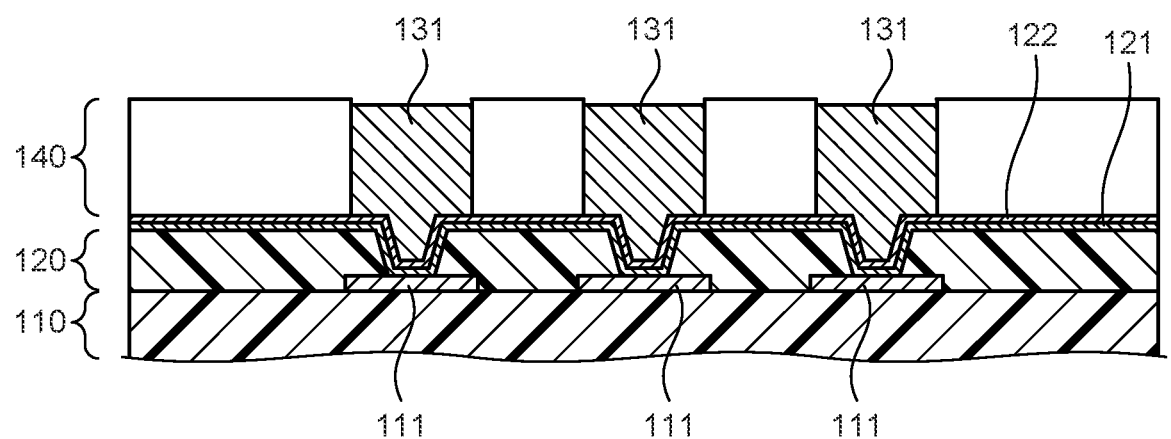
FIG. 8 is a diagram illustrating a specific example of an electrolytic plating step.
Figure 9:
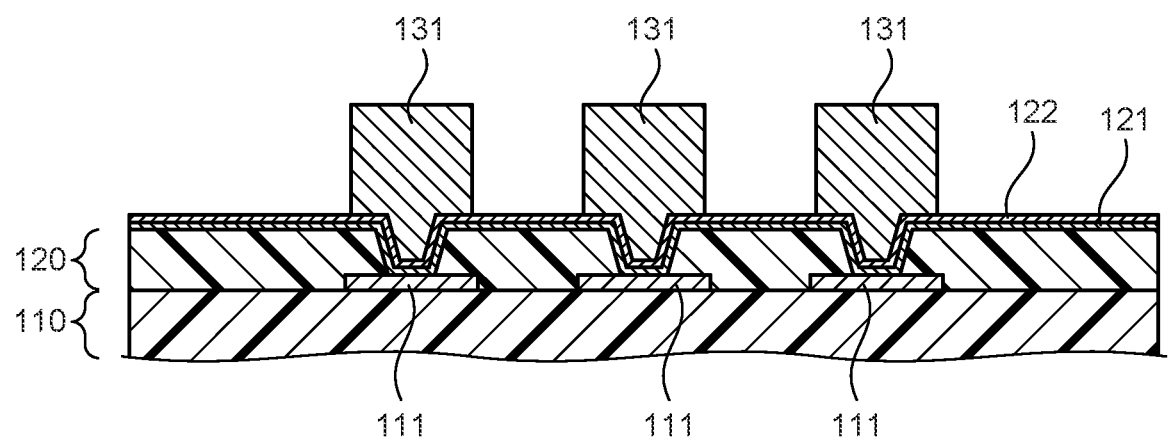
FIG. 9 is a diagram illustrating a specific example of a resist layer removing step.

Then, the pads 131 are formed in the opening portions of the resist layer 140 by an electrolytic plating method using the seed layer 122 as a power supply layer (step S106). Specifically, for example, as illustrated in FIG. 8, copper (Cu) is deposited inside the via-holes 120a and inside the opening portions of the resist layer 140 to form the pads 131. After the pads 131 are formed, the resist layer 140 is removed by, for example, an alkaline peeling solution (step S107). As a result, for example, as illustrated in FIG. 9, a structure body in which the pads 131 protrude upward from the seed layer 122 on the upper surface 120b of the insulating layer 120 is obtained.

Figure 10:
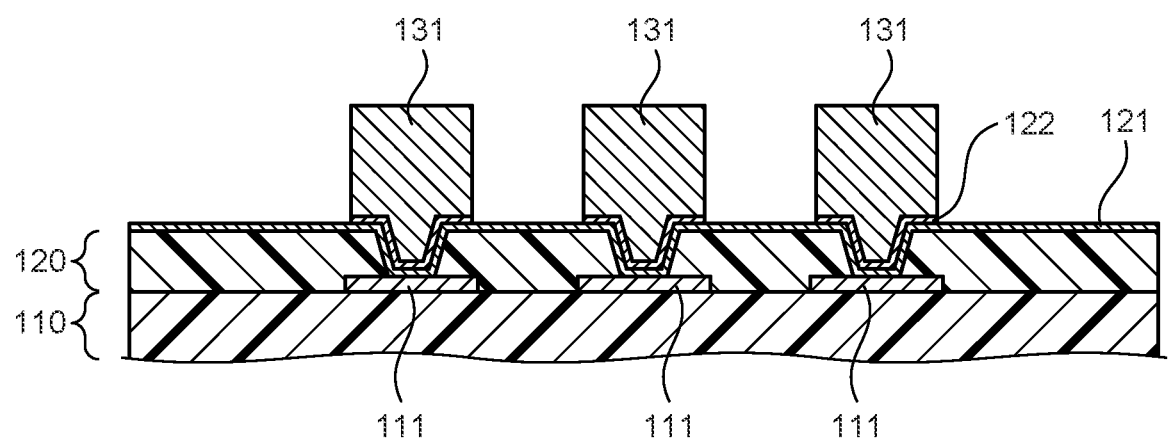
FIG. 10 is a diagram illustrating a specific example of a seed layer etching step.

Then, using the pads 131 serving as masks, a part of the seed layer 122 that is not covered by the pads 131 is removed by etching (step S108). Specifically, for example, as illustrated in FIG. 10, in the part that is not covered by the pads 131, only the seed layer 122 is selectively removed without removing the adhesion layer 121. That is, for example, by wet etching performed using an etching solution such as sulfuric acid-hydrogen peroxide or persulfate, only the seed layer 122 made of copper (Cu) is removed without removing the adhesion layer 121 made of titanium (Ti). Alternatively, the seed layer 122 may be removed by a dry process such as plasma treatment.

Figure 11A:
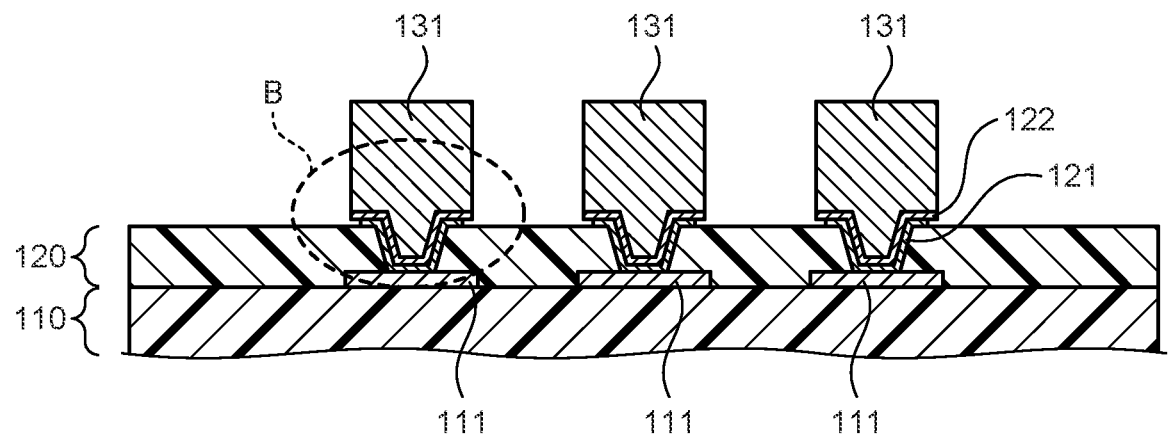
FIGS. 11A and 11B are diagrams illustrating a specific example of an adhesion layer etching step.

Subsequently, using the pads 131 and the remaining seed layer 122 serving as masks, a part of the adhesion layer 121 that is not covered by the pads 131 is removed by etching (step S109). Specifically, for example, as illustrated in FIG. 11A, a part of the adhesion layer 121 that is not covered by the pads 131 is removed. That is, by wet etching performed using an etching solution such as caustic alkali-hydrogen peroxide, only the adhesion layer 121 made of titanium (Ti) is removed without removing the pads 131 and the seed layer 122 made of copper (Cu).

Figure 11B:
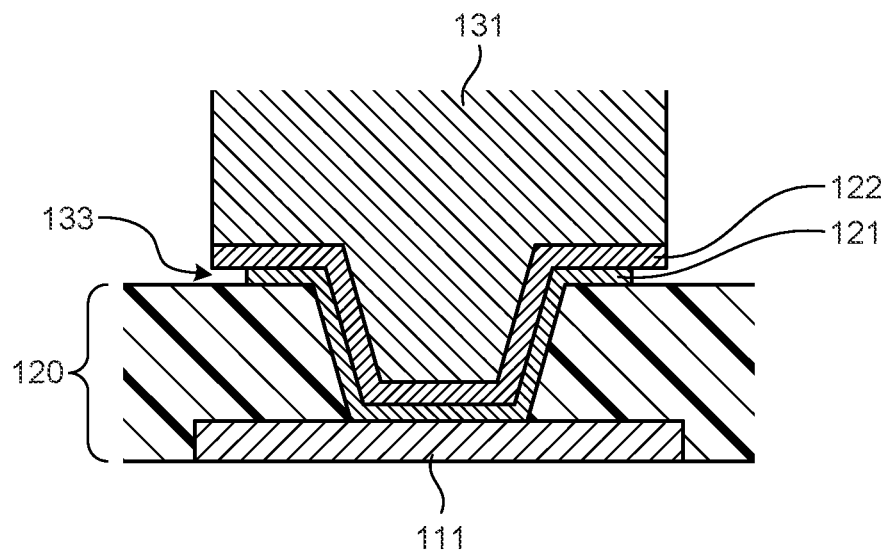

Furthermore, for example, by adjusting a time to be immersed in the etching solution, the adhesion layer 121 on the lower side of the side end portion of the seed layer 122 is removed. That is, as illustrated in FIG. 11B in which the part B in FIG. 11A is enlarged, the adhesion layer 121 is removed so that the side end portion of the adhesion layer 121 is positioned closer to the center side of the pad 131 than the side end portion of the seed layer 122 is. As a result, the gap 133 is formed between the lower surface of the side end portion of the seed layer 122 and the upper surface 120b of the insulating layer 120. A distance between the side end portion of the seed layer 122 and the side end portion of the adhesion layer 121 (that is, a width of the gap 133) can be, for example, approximately 300 nm.

Figure 12A:
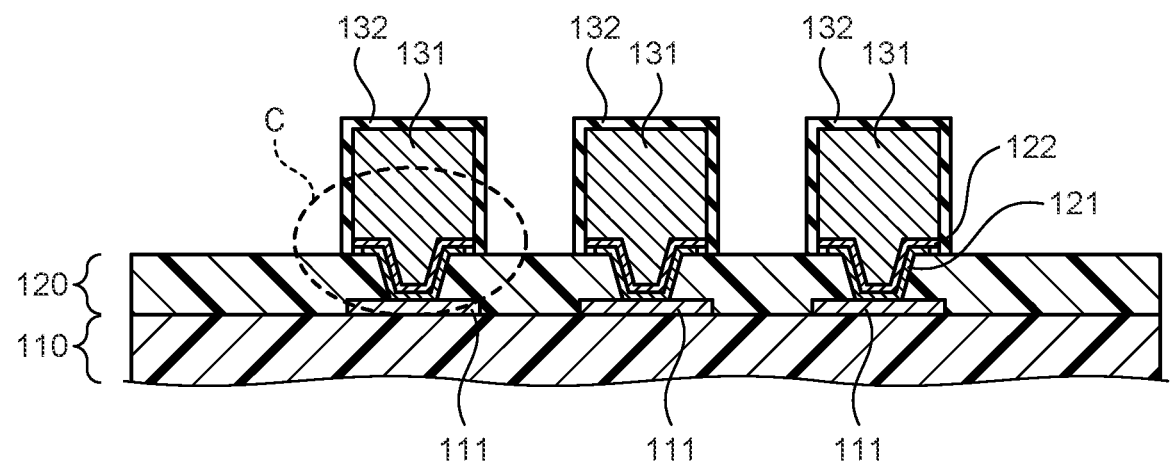
FIGS. 12A and 12B are diagrams illustrating a specific example of a surface treatment layer forming step.

For example, the surface treatment layer 132 covering the upper surface and the side surface of each of the pads 131 is formed by an electroless plating method (step S110). Specifically, for example, as illustrated in FIG. 12A, the surface treatment layer 132 that covers the upper surface and the side surface of the pad 131 and that reaches the upper surface 120b of the insulating layer 120 is formed. As a result, the connection terminals 130 each including the pad 131 and the surface treatment layer 132 are completed.

Figure 12B:
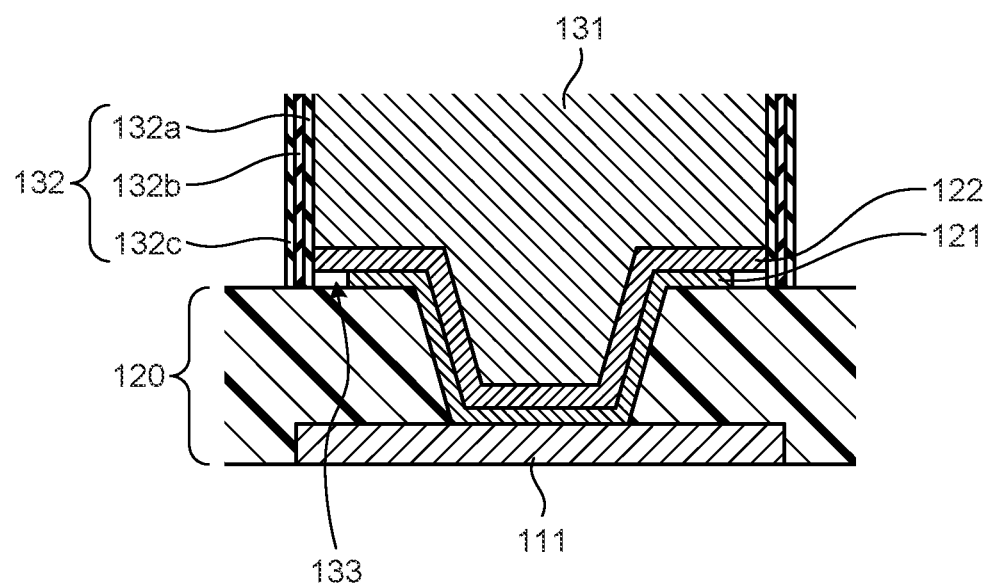

In a case of forming the surface treatment layer 132, as illustrated in FIG. 12B, in which the part C in FIG. 12A is enlarged, the Ni layer 132a, the Pd layer 132b, and the Au layer 132c are laminated on the upper surface and side surface of the pad 131 so that the gap 133 remains between the lower surface of the seed layer 122 and the upper surface 120b of the insulating layer 120. In other words, by forming the surface treatment layer 132, the gap 133 is formed to be surrounded by the end portion of the adhesion layer 121, the lower surface of the seed layer 122, the upper surface 120b of the insulating layer 120, and the Ni layer 132a. As the surface treatment layer 132, Ni and Au layers may be formed instead of the Ni, Pd, and Au layers.

In order to form the Ni layer 132a of the surface treatment layer 132 on the surface of the pads 131 by an electroless plating method, palladium (Pd) is used as a catalyst, for example. The palladium (Pd) used as the catalyst adheres to the upper surface and side surfaces of the pads 131, and also adheres to the lower surface of the seed layer 122, which is in contact with the gap 133. However, the distance between the lower surface of the seed layer 122 and the upper surface 120b of the insulating layer 120 (that is, the height of the gap 133) is approximately 10 nm to 500 nm, which is equal to the thickness of the adhesion layer 121 and is very small. Therefore, the catalyst adhering to the lower surface of the seed layer 122 is inactive, and nickel is not deposited in the gap 133. Furthermore, since the gap 133 is small, it is difficult for a plating solution to progress into the gap 133 due to the surface tension of the plating solution, and nickel is not deposited in the gap 133. As a result, even in a case where the Ni layer 132a is formed, the gap 133 remains between the lower surface of the seed layer 122 and the upper surface 120b of the insulating layer 120.

In this way, the electronic components such as the semiconductor chips are mounted on the wiring board 100 on which the connection terminal 130 having the gap 133 is formed. In this case, the connection terminal 130 of the wiring board 100 and the connection terminal of the electronic component are joined to each other by solder. Therefore, a solder bump is formed on the surface of the Au layer 132c in the surface treatment layer 132 of the connection terminal 130. In the present embodiment, since the gap 133 is formed on the lower outer circumference of the connection terminal 130, the path where the copper atoms diffuse from the lower surface of the seed layer 122 to the surface treatment layer 132 is separated. As a result, the diffusion of the copper atoms into the solder bump can be suppressed, and the occurrence of cracks inside the solder can be suppressed.

As described above, according to the present embodiment, on the lower portion of the connection terminal in which the pad is covered with the surface treatment layer, the side end portion of the seed layer extends to the same position as the side surface of the pad, whereas the side end portion of the adhesion layer below the seed layer is positioned closer to the center side than the side surface of the pad is, and the gap is formed to be surrounded by the end portion of the adhesion layer, the lower surface of the seed the upper surface of the insulating d the surface treatment layer. Therefore, the path from the lower surface of the seed layer, which has small crystal grains and through which copper atoms easily diffuse, to the solder bonded to the surface treatment layer is separated, and the diffusion of the copper atoms, is suppressed. As a result, the alloy layer containing copper is not formed inside the solder, and the occurrence of cracks in the solder can be suppressed.

Figure 13:
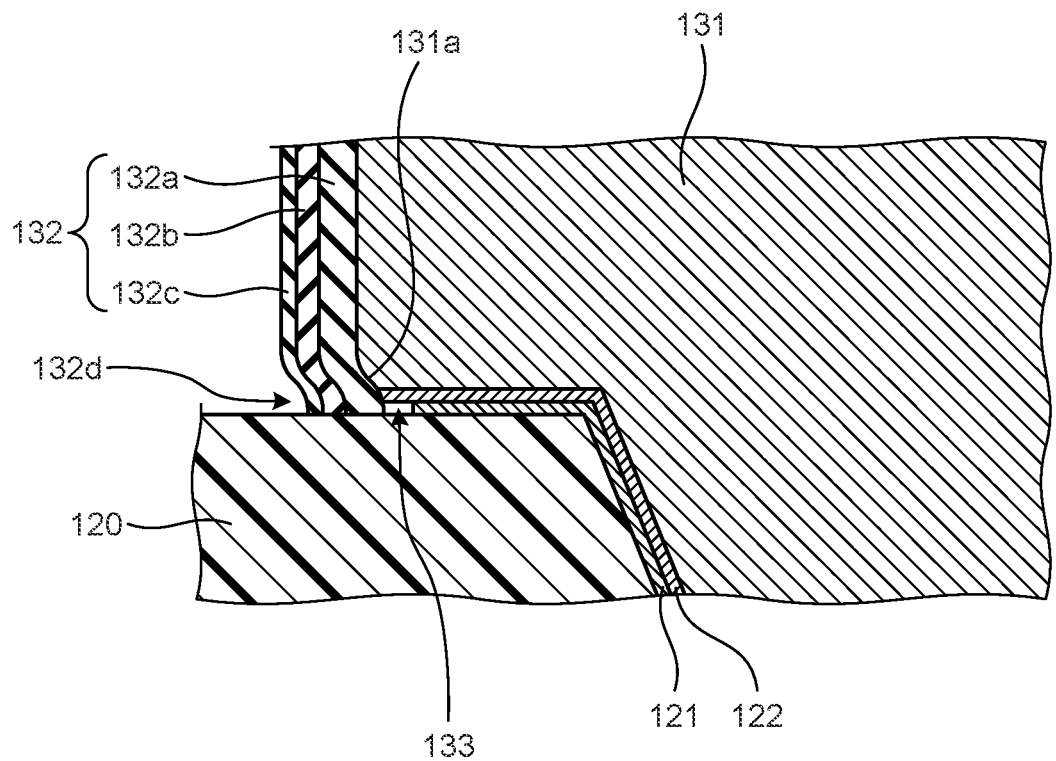
FIG. 13 is a diagram explaining a modified example of the wiring board according to the embodiment.

In the above embodiment, the side end portion of the seed layer 122 extends to the same position as the side surface of the pad 131, but the position of the side end Portion of the seed layer 122 is not limited thereto. That is, for example, at the etching step of the seed layer 122, the side end portion of the seed layer 122 may be positioned closer to the center side than the side surface of the pad 131 is by adjusting a time to be immersed in the etching solution. Specifically, for example, as illustrated in FIG. 13, the seed layer 122 may be removed closer to the center side than the side surface of the pad 131 is.

In this case, since the pad 131 and the seed layer 122 are both made of copper (Cu), in a case where etching is performed with an etching solution such as sulfuric acid-hydrogen peroxide or persulfate, the pad 131 is also dissolved as well as the seed layer 122. Therefore, an inclined plane 131a facing diagonally downward is formed at a lower end of the side surface of the pad 131. Then, when the surface treatment layer 132 is formed, a catalyst also adheres to the inclined plane 131a, and for example, nickel forming the Ni layer 132a is deposited from the inclined plane 131a. As a result, the Ni layer 132a grows in a direction from the inclined plane 131a toward the upper surface 120b or the insulating layer 120, and the lower end of the surface treatment layer 132 can reliably reach the upper surface 120b of the insulating layer 120.

In a case where the side end portion of the seed layer 122 is positioned closer to the center side than the side surface of the pad 131 is, as the inclined plane 131a is formed on the pad 131, a narrowed portion 132d is formed at the lower end of the surface treatment layer 132. That is, since the surface treatment layer 132 covers the side surface of the pad 131 as well as the inclined pane 131a and the end portion of the seed layer 122, the lower end of the surface treatment layer 132 is narrowed toward the center side of the pad 131 according to the positions of the inclined plane 131a and the end portion of the seed layer 122.

Even in this case, the side end portion of the seed layer 122 is in contact with, for example, the Ni layer 132a, which is the innermost layer of the surface treatment layer 132. On the other hand, the side end portion of the adhesion. layer 121 is positioned further closer to the center side of the pad 131 than the side end Portion of the seed layer 122 is. Therefore, even in case where the narrowed portion 132d is formed on the surface treatment layer 132, the gap 133 is formed to be surrounded by the end portion of the adhesion layer 121, the lower surface of the seed layer 122, the upper surface 120b of the insulating layer 120, and the surface treatment layer 132. Therefore, the diffusion path of the copper atoms from the lower surface of the seed layer 122 to the surface treatment layer 132 is separated, and the occurrence of cracks in the solder can be suppressed.

Figure 14:
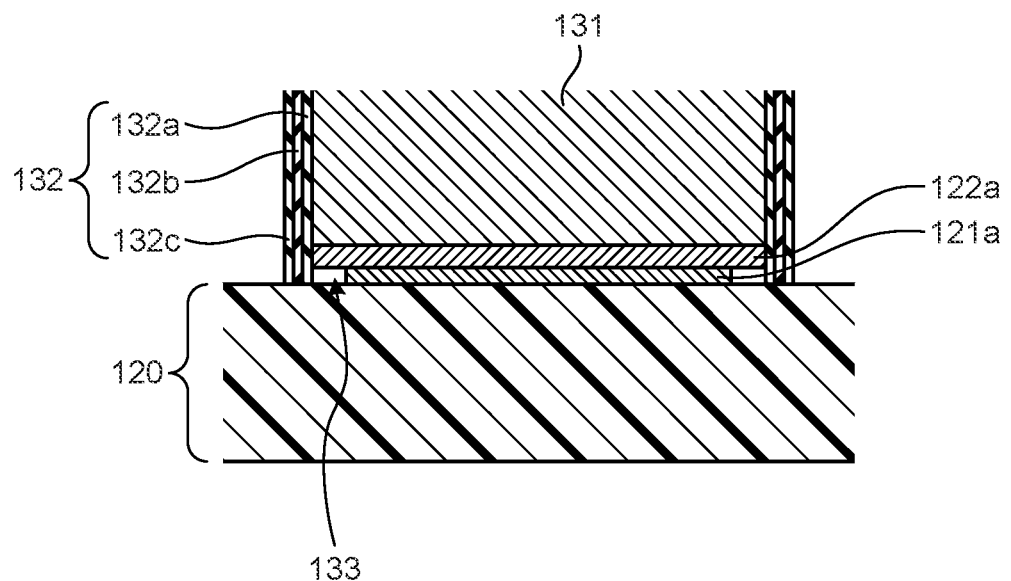
FIG. 14 is a diagram explaining another modified example of the wiring board according to the embodiment.

In the above-described embodiment, the connection terminals 130 are provided at the positions of the via-holes 120*a* formed in the insulating layer 120, but the connection terminals are not necessarily provided at the positions of the via-holes. Specifically, for example, the connection terminals may each be formed on a flat part of the upper surface 120*b* of the insulating layer 120. Even in such a case, for example, as illustrated in FIG. 14, the side end portion or a seed layer 122*a* is in contact with the surface treatment layer 132, while the side end portion of an adhesion layer 121*a* is positioned closer to the center side of the pad 131 than the surface treatment layer 132 is, whereby the gap 133 is formed.

With respect to the embodiments and the variety thereof described above, the following notes are further disclosed.

(Note A) A method of manufacturing a wiring board, the method including:
first laminating a first metal layer on an upper surface of an insulating layer;
second laminating a second metal layer on an upper surface of the first metal layer;
forming a metal pad on an upper surface of the second metal layer;
first removing a part of the second metal layer, the part being not covered by the pad;
second removing a part of the first metal layer, the part being not covered by the pad; and
forming a sur ace treatment layer that covers an upper surface and a side surface of the pad, wherein
the second removing includes,
removing the part of the first metal layer positioned closer to a center side of the pad than an end portion of the second metal after the first removing, and
the forming the surface treatment layer includes,
forming the surface treatment layer to have a gap between an end portion of the first metal layer after the second removing and the surface treatment layer.

(Note B) The method of manufacturing a wiring board according to Note A, wherein the second removing includes, removing the part of the first metal layer by wet etching using hydrofluoric acid as an etching solution.

One aspect of the wiring board and the method of manufacturing the wiring board disclosed in the present application provides the effect of suppressing the occurrence of cracks in the solder.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A wiring board comprising:
an insulating layer; and
a connection terminal formed on an upper surface of the insulating layer, wherein
the connection terminal includes
a first metal layer laminated on the upper surface of the insulating
a second metal layer laminated on an per surface of the first metal layer,
a metal pad laminated on an upper surface of the second metal layer, and
a surface treatment layer that covers an upper surface and a side surface of the pad and that is in contact with the upper surface of the insulating layer,
an end portion of the second metal layer is in contact with the surface treatment layer, and
an end portion of the first metal layer is positioned closer to a center side of the pad than the end portion of the second metal layer is to form a gap between the end Portion of the first metal layer and the surface treatment layer.

2. The wiring board according to claim 1, wherein
the second metal layer is a layer made of a same metal as the pad, and
the first metal layer is a layer made of a metal different from the second metal layer.

3. The wiring board according to claim 1, wherein
the end portion of the second metal layer extends to a same position as the side surface of the pad, and
the surface treatment layer covers the end portion of the second metal layer as well as the side surface of the pad.

4. The wiring board according to claim 1, wherein
the end portion of the second metal layer is positioned closer to the center side than the side surface of the pad is
the pad has an inclined plane through which the side surface of the pad and the end portion of the second metal layer are connected, and
the surface treatment layer covers the inclined plane and the end portion of the second metal layer as well as the side surface of the of the pad.

* * * * *